United States Patent
Liao (10) Patent No.: US 8,000,111 B2
(45) Date of Patent: Aug. 16, 2011

(54) ELECTRONIC DEVICE STRUCTURE

(75) Inventor: Fei-Chin Liao, Taipei (TW)

(73) Assignee: Inventec Corporation, Taipei (TW)

( * ) Notice: Subject to any disclaimer, the term of this patent is extended or adjusted under 35 U.S.C. 154(b) by 467 days.

(21) Appl. No.: 12/324,997

(22) Filed: Nov. 28, 2008

(65) Prior Publication Data

US 2010/0079960 A1 Apr. 1, 2010

(30) Foreign Application Priority Data

Oct. 1, 2008 (TW) .............................. 97137823 A (51) Int. Cl.
*H05K 7/02* (2006.01)
*H05K 5/00* (2006.01)
*H05K 7/16* (2006.01)
*H05K 1/14* (2006.01)
*H05K 7/14* (2006.01)
*H01R 4/66* (2006.01)

(52) U.S. Cl. ........ 361/807; 361/758; 361/759; 361/726; 361/810; 361/740; 361/742; 361/801; 361/804; 439/92

(58) Field of Classification Search .......... 361/724–729, 361/740, 732, 759, 758, 801–804, 807, 810, 361/752, 742, 753, 770; 439/92, 95, 325–328; 174/138 E; 29/739, 757, 832, 450, 456; 24/289, 24/293–295, 457–458, 290; 220/527, 529, 220/625, 626, 627
See application file for complete search history.

(56) References Cited

U.S. PATENT DOCUMENTS

| 6,017,226 | A  | * | 1/2000 | Jeffries et al. | .................. | 439/92 |
| 6,215,667 | B1 | * | 4/2001 | Ady et al. | ...................... | 361/752 |
| 6,249,442 | B1 | * | 6/2001 | Watanabe | ..................... | 361/801 |
| 6,262,887 | B1 | * | 7/2001 | Lee | ........................... | 361/679.27 |
| 7,227,761 | B2 | * | 6/2007 | Estes et al. | ..................... | 361/810 |
| 7,491,070 | B2 | * | 2/2009 | Chen et al. | ...................... | 439/92 |
| 7,710,728 | B2 | * | 5/2010 | Arisaka et al. | ................ | 361/719 |
| 2005/0079748 | A1 | * | 4/2005 | Kim | ............................... | 439/92 |

FOREIGN PATENT DOCUMENTS

TW 576515 Y 2/2004

* cited by examiner

*Primary Examiner* — Jayprakash N Gandhi
*Assistant Examiner* — Nidhi Desai
(74) *Attorney, Agent, or Firm* — James W. Huffman (57) ABSTRACT

An electronic device structure includes an upper case, a lower case, a main board, a suspending member, and a fixing member. The upper case and the lower case respectively have an upper combining column and a lower combining column. The main board has a through hole, the upper combining column passes through the through hole, and a size of the through hole is larger than a size of the upper combining column, such that a moving gap is kept between the upper combining column and the through hole. The suspending member is combined with a side of the main board and spaced with the main board by a suspending distance. The fixing member passes through the lower combining column and the suspending member and is fixed on the upper combining column, such that the main board is disposed on the lower combining column through the suspending member.

6 Claims, 9 Drawing Sheets

ELECTRONIC DEVICE STRUCTURE

CROSS-REFERENCE TO RELATED APPLICATIONS

This non-provisional application claims priority under 35 U.S.C. §119(a) on Patent Application No(s). 097137823 filed in Taiwan, R.O.C. on Oct. 1, 2008 the entire contents of which are hereby incorporated by reference.

BACKGROUND OF THE INVENTION

1. Field of Invention

The present invention relates to an electronic device, and more particularly to an electronic device structure with a main board capable of shifting towards triaxial directions.

2. Related Art

Recently, with the rapid development of the technology, computer apparatus has become indispensable in working or living. The electronic products are increasingly developed towards being miniaturized and being light, thin, short, and small. For users usually moving outside, portable electronic products such as notebook computers are more conveniently carried, and thus greatly improve the using convenience. A main board must be assembled in the notebook to serve as a core member of a computer system, so as to successfully execute preset functions of the peripheral hardware electrically connected to the main board.

For the recently common manner of fixing the main board, a plurality of conductive bosses serving as the fixing members is disposed on a lower case of the notebook computer device, and a plurality of through holes corresponding to the bosses is opened on the main board. The main board is placed on the bosses with an appropriate distance kept between the main board and lower case. Then, a plurality of screw bolts respectively passes through the through holes of the main board, and is locked on the bosses, such that the main board is suspended through the bosses, thereby preventing weld joint contacts on a back surface of the main board from directly contacting with the case to result in a short circuit. Finally, the upper case is combined with the lower case, and the main board and the two cases are serially locked together.

For the conventional manner of locking and fixing the main board through the bosses, although the main board may be tightly fixed between the two upper and lower cases, the main board directly contacts with the case, thus lacking a buffer mechanism design. When the notebook computer is impacted, or falls on the ground, the electronic members electrically disposed on the main board may be damaged due to the impact, or the main board may be displaced as the fixing position is broken.

In order to solve the above problems, ROC patent No. 576515 disclosed a main board fixing device, in which a flexible pin is used to replace the screw to fix the main board, thereby increasing the buffer capability of the main board during impact. Although ROC patent No. 576515 provides good buffer capability of the main board, after a long time of use, the pin may be loose by reason of the aging of the material, so the fixing effect is poorer than that of the screw.

Particularly, for a main board with a ball grid array (BGA) package, no matter for the manner of fixing the main board through the screw or through the pin, when the screw is tightly screwed or the pin is inserted in the pin hole, the main board cannot shift in a horizontal direction (i.e. the X axis direction and the Y axis direction) because of the fixing of the screw or the pin, so the stress of the main board can only deform towards a vertical direction (i.e. the Z axis direction). In this manner, the BGA package structure of the main board may be damaged, such that the electrical connection may be lost between the chip and the main board.

SUMMARY OF THE INVENTION

In view of the above problem, the present invention provides an electronic device structure, thereby eliminating the problem in the conventional art that the manner of fixing the main board is lack of the buffer mechanism, such that the main board is damaged and loses the electrical connection function.

The electronic device structure of the present invention includes an upper case, a lower case, a main board, a suspending member, and a fixing member. A lateral side of the upper case has an upper combining column, and the upper combining column has a fixing hole. A lateral side of the lower case corresponding to the upper case has a lower combining column, and the lower combining column has a hole. The main board is disposed between the upper case and the lower case, and has a through hole and a plurality of combining slots. The upper combining column passes through the through hole, a size of the through hole is larger than a size of the upper combining column, such that a moving gap is kept between the upper combining column and the through hole.

The suspending member is disposed between the main board and the lower case, and has a combining portion and two suspending wings extending from the combining portion, The combining portion leans against the lower combining column, and has a combining hole. The two suspending wings respectively have a first deforming segment and at least one second deforming segment extending from the first deforming segment, so as to have the elastic deformation characteristic. The second deforming segment is embedded in the combining slot of the main board, such that the combining portion and the main board are spaced by a suspending distance. The fixing member passes through the hole of the lower combining column and the combining hole of the suspending member, and is fixed in the fixing hole of the upper combining column, such that the main board is disposed on the lower combining column through the suspending member.

The present invention has the following efficacies. Through the moving gap and the suspending distance generated by the matching of the sizes of the through hole and the upper combining column and the disposition of the suspending member, the main board may shift towards triaxial directions, thus having good buffer capability, preventing the main board from deforming or being damaged by impact of the external force or by the stress.

BRIEF DESCRIPTION OF THE DRAWINGS

The present invention will become more fully understood from the detailed description given herein below for illustration only, and thus are not limitative of the present invention, and wherein.

DETAILED DESCRIPTION OF THE INVENTION

An electronic device structure of the present invention includes, but not limited to, a notebook computer, a flat panel computer, an ultra mobile personal computer (UMPC), a personal digital assistant (PDA), and other portable computer devices. In the detailed description of the present invention, the notebook computer is used as the most preferred embodiment of the present invention. However, the accompanying drawings are only used for reference and description without limiting the present invention.

Figure 1:
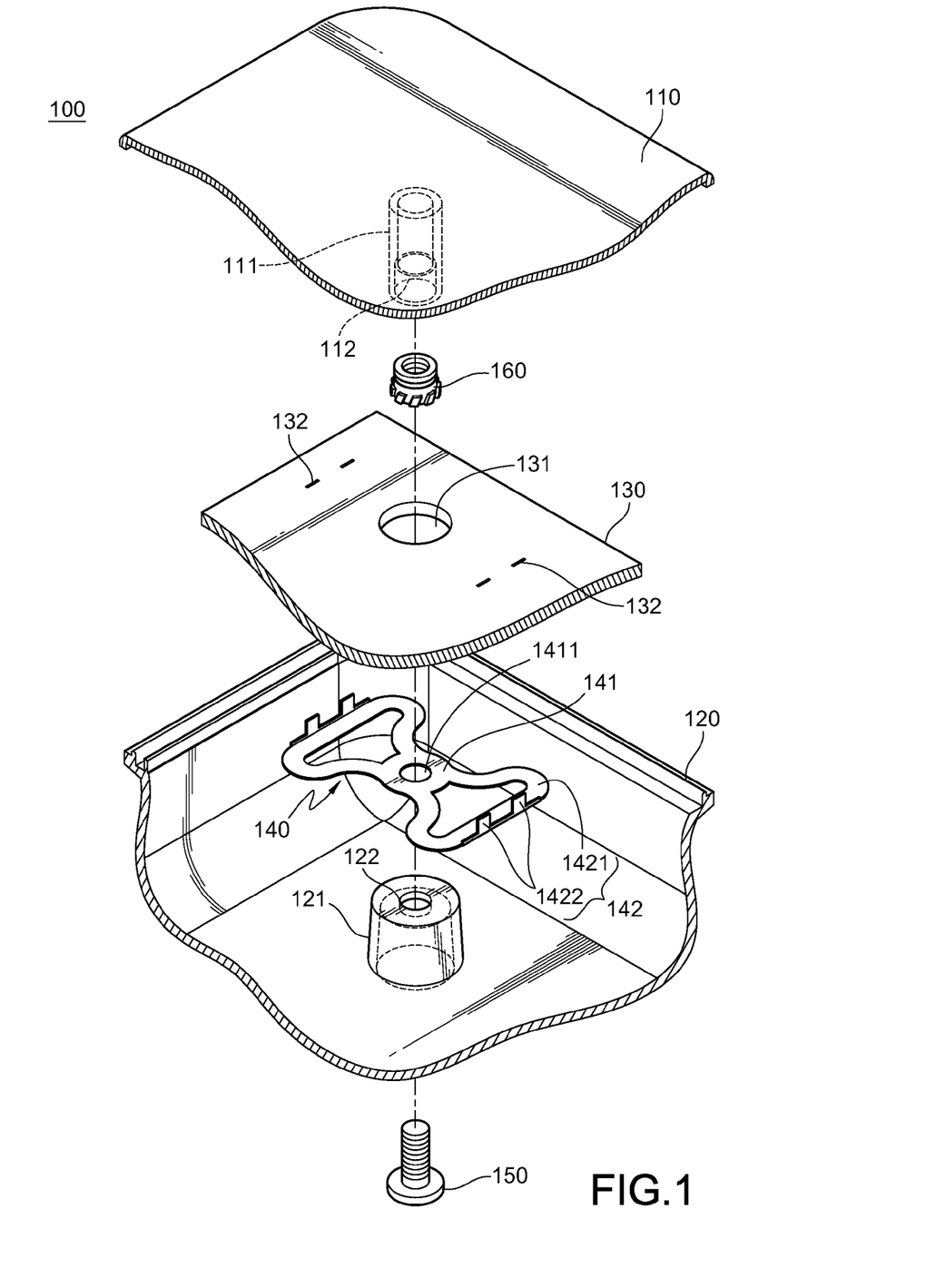
FIG. 1 is an exploded view of a first embodiment of the present invention.
Figure 2:
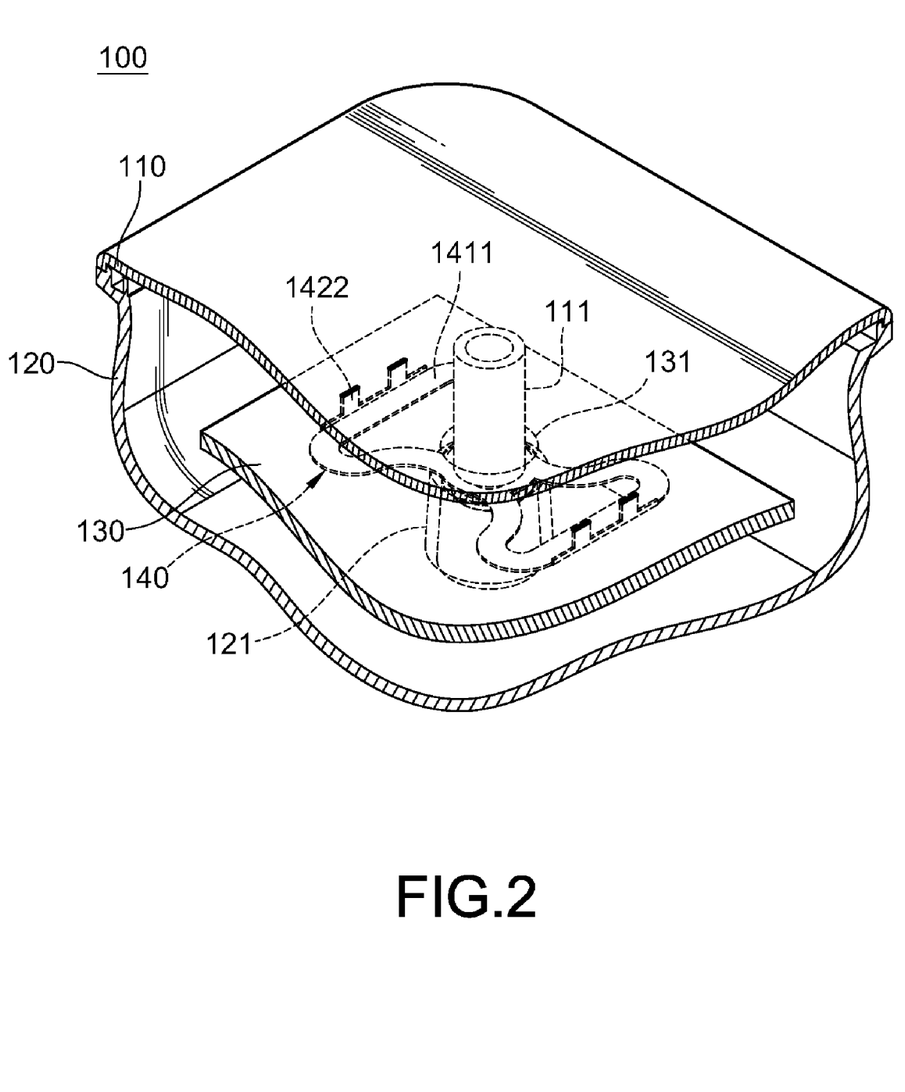
FIG. 2 is a schematic view of the first embodiment of the present invention.
Figure 3:
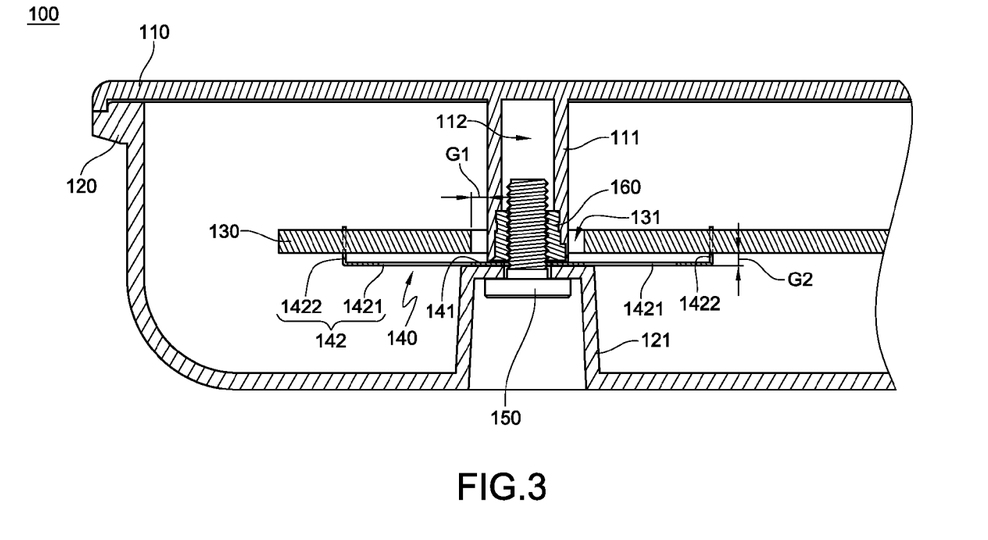
FIG. 3 is a cross-sectional side view of the first embodiment of the present invention.

Referring to FIGS. 1 to 3, an electronic device 100 according to a first embodiment of the present invention includes an upper case 110, a lower case 120, a main board 130, a suspending member 140, and a fixing member 150. An upper combining column 111 is protruded on an inner lateral side of the upper case 110, and the upper combining column 111 has a fixing hole 112. A screw nut 160 is further installed in the fixing hole 112 of the upper combining column 111, and the screw nut 160 is installed in the fixing hole 112 in an in mold forming manner or by being urged with an external force. A lower combining column 121 corresponding to the upper combining column 111 is protruded on an inner lateral side of the lower case 120, and a hole 122 is opened on the lower combining column 121.

The main board 130 is disposed between the upper case 110 and the lower case 120, a through hole 131 and a plurality of combining slots 132 are opened on the main board 130. The upper combining column 111 of the upper case 110 passes through the through hole 131, and an aperture size of the through hole 131 is larger than an outside diameter size of the upper combining column 111, such that a moving gap G1 is kept between the upper combining column 111 and the through hole 131.

Referring to FIGS. 1 to 3, the suspending member 140 is disposed between the main board 130 and the lower case 120. The suspending member 140 is an integrally formed structure made of a metal material, and has a combining portion 141 and two symmetric suspending wings 142 extending from two sides of the combining portion 141. The combining portion 141 leans against the lower combining column 121, and the combining portion 141 has a combining hole 1411. The two suspending wings 142 respectively have a first deforming segment 1421 and a second deforming segment 1422 extending from the first deforming segment 1421, and the first deforming segment 1421 encircles to form a shape with a hollow region, such that the suspending wings 142 have the elastic deformation capability. The second deforming segment 1422 is embedded in the combining slot 132 of the main board 130, such that the combining portion 141 of the suspending member 140 and the main board 130 are spaced by a suspending distance G2.

The fixing member 150 according to the first embodiment of the present invention is a screw bolt, the fixing member 150 passes through the hole 122 of the lower combining column 121 and the combining hole 1411 of the suspending member 140, and is locked in the screw nut 160 in the fixing hole 112 of the upper combining column 111. Therefore, the main board 130 is fixed between the upper and the lower cases 110 and 120, and the main board 130 is placed on the lower combining column 121 of the lower case 120 through the suspending member 140.

In the present invention, the moving gap G1 exists between the main board 130 and the upper combining column 111, such that the main board 130 may slightly shift towards a horizontal direction (i.e. the X axis direction and the Y axis direction). A suspending distance G2 exists between the main board 130 and the suspending member 140, such that the main board 130 has a deforming tolerance in a vertical direction (i.e. the Z axis direction). Because of the design of the moving gap G1 and the suspending distance G2, the main board 130 is in a floating state. When the first deforming segment 1421 and the second deforming segment 1422 of the suspending member 140 are impact by an external force, an elastic deformation function may be provided, so the main board 130 has preferred buffer capability, thereby preventing the main board 130 from being deformed by reason of the external force impact or the stress generated during locking.

Figure 4:
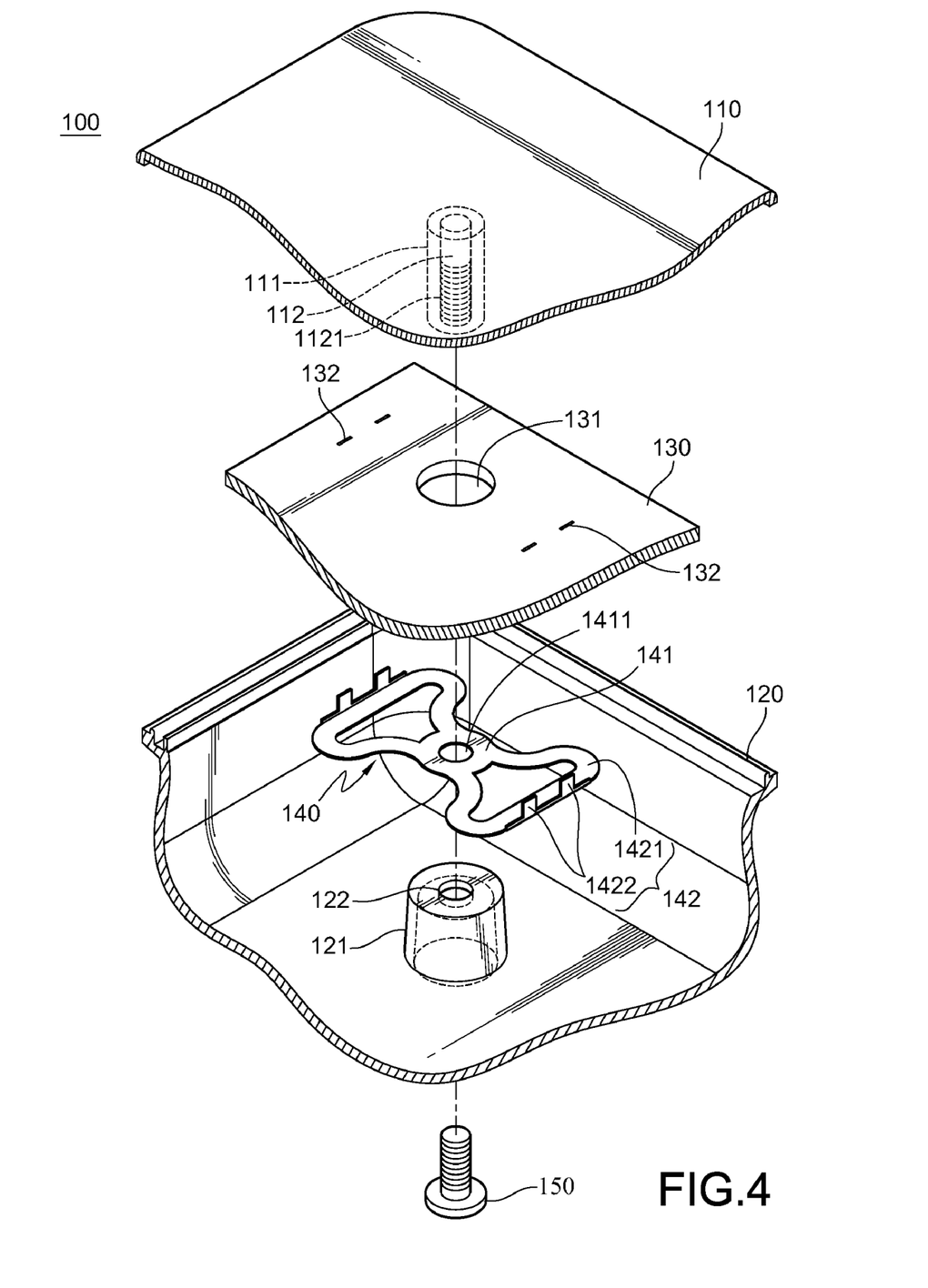
FIG. 4 is an exploded view of a second embodiment of the present invention.
Figure 5:
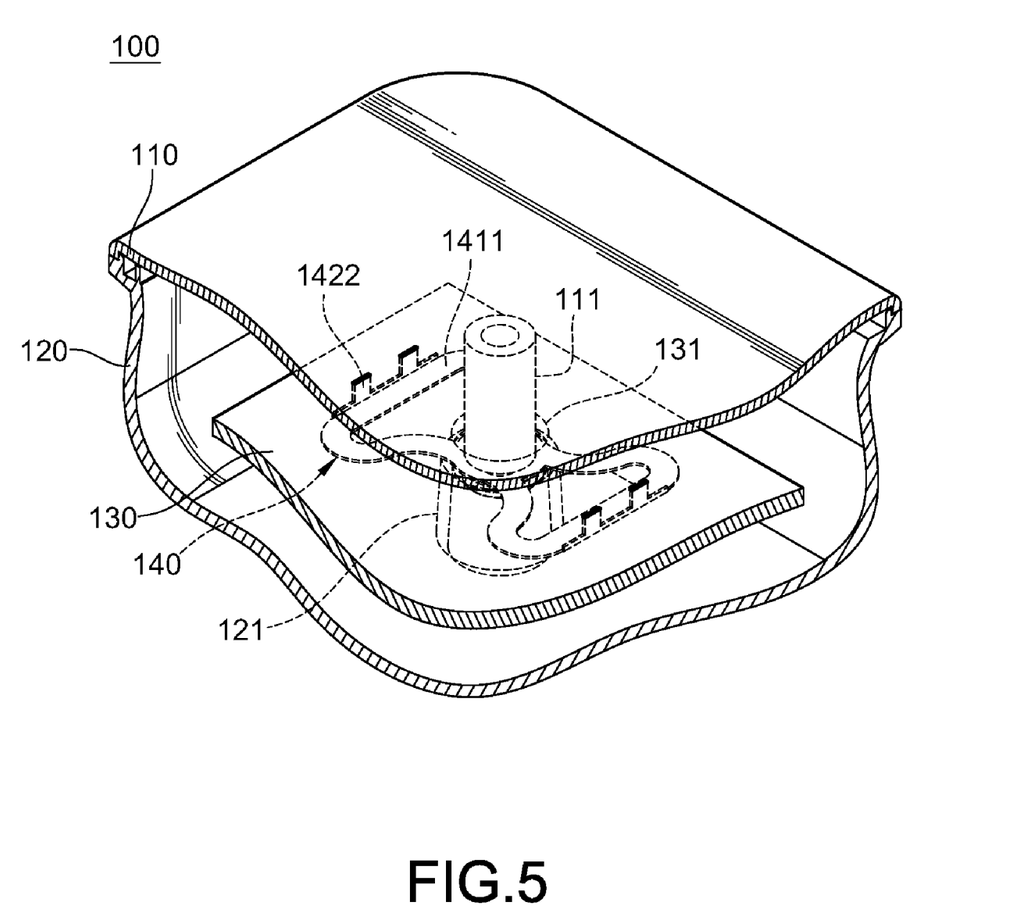
FIG. 5 is a schematic view of the second embodiment of the present invention.
Figure 6:
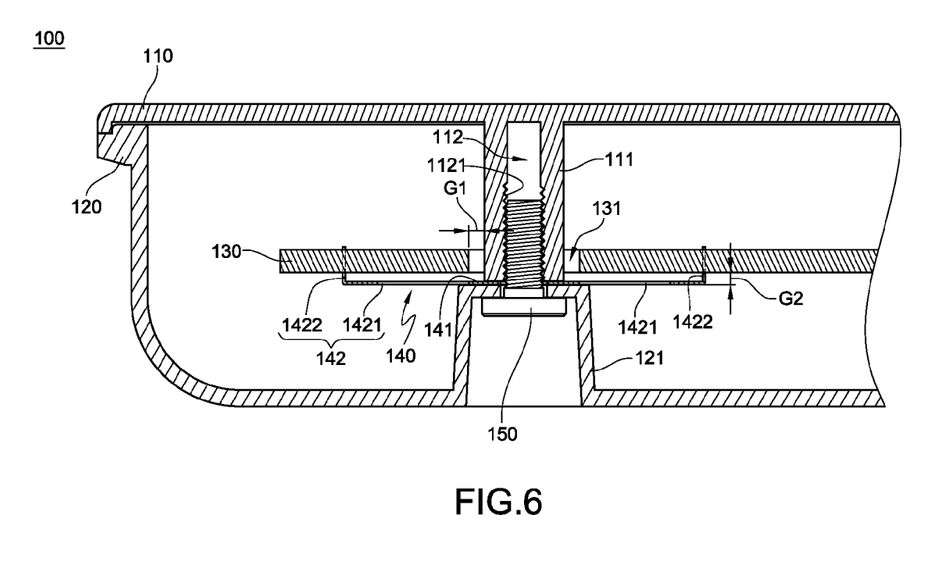
FIG. 6 is a cross-sectional side view of the second embodiment of the present invention.

As shown in FIGS. 4 to 6, the element assembly and the disposition relation of the electronic device 100 according to a second embodiment of the present invention are the same as that of the first embodiment, and thus are not repeated here. The difference between the two embodiments lies in the manner of combining the fixing member 150 and the upper combining column 111. The screw nut of the first embodiment is omitted in the upper combining column 111 of the second embodiment of the present invention, instead, a screw thread 1121 is designed on an inner edge of the fixing hole 112 of the upper combining column 111. The fixing member 150 according to the second embodiment is a screw bolt, the fixing member 150 passes through the hole 122 and the combining hole 1411, and directly locks with the screw thread 1121 in the fixing hole 112, such that the main board 130 is fixed between the upper and the lower cases 110 and 120.

Figure 7:
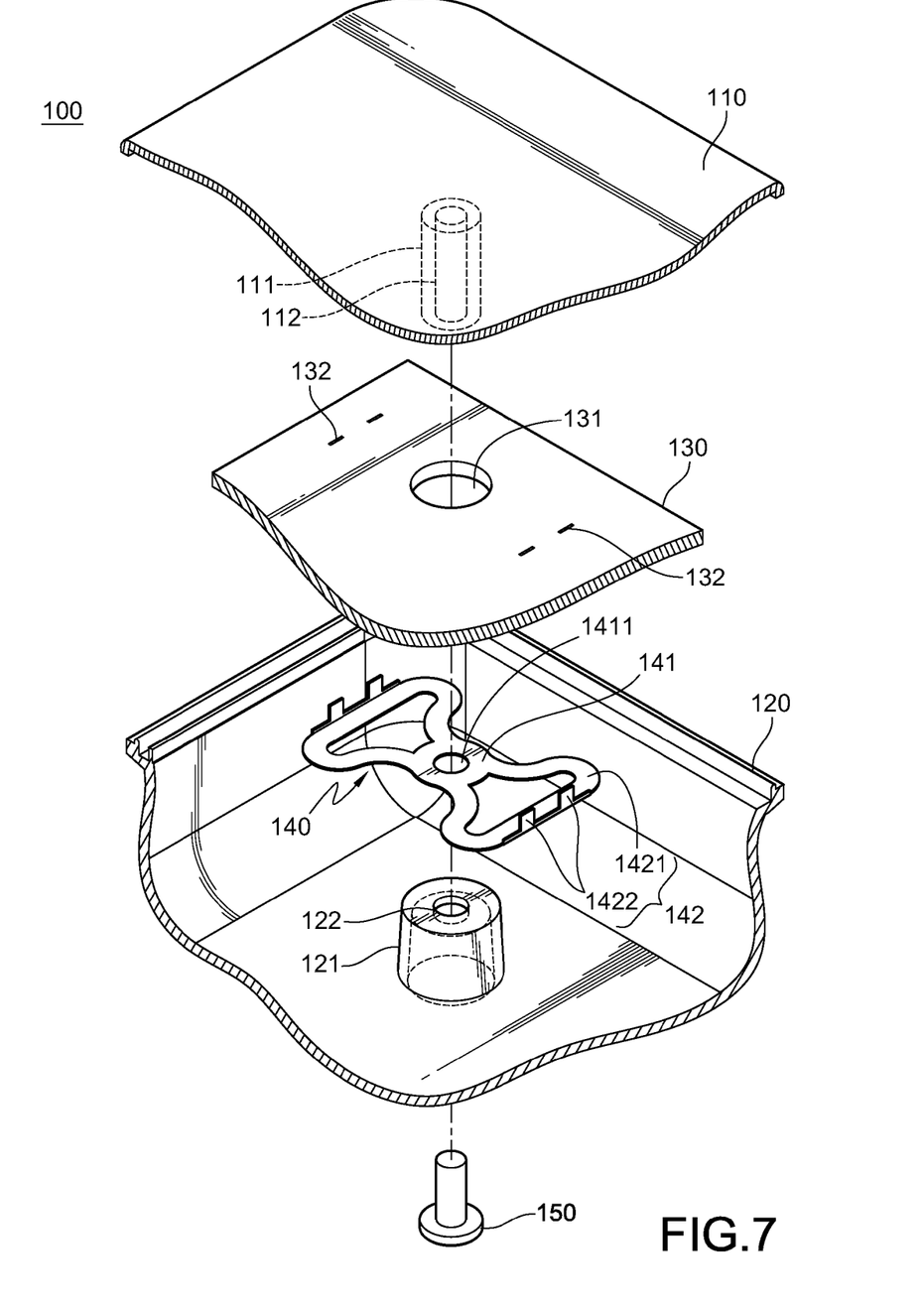
FIG. 7 is an exploded view of a third embodiment of the present invention.
Figure 8:
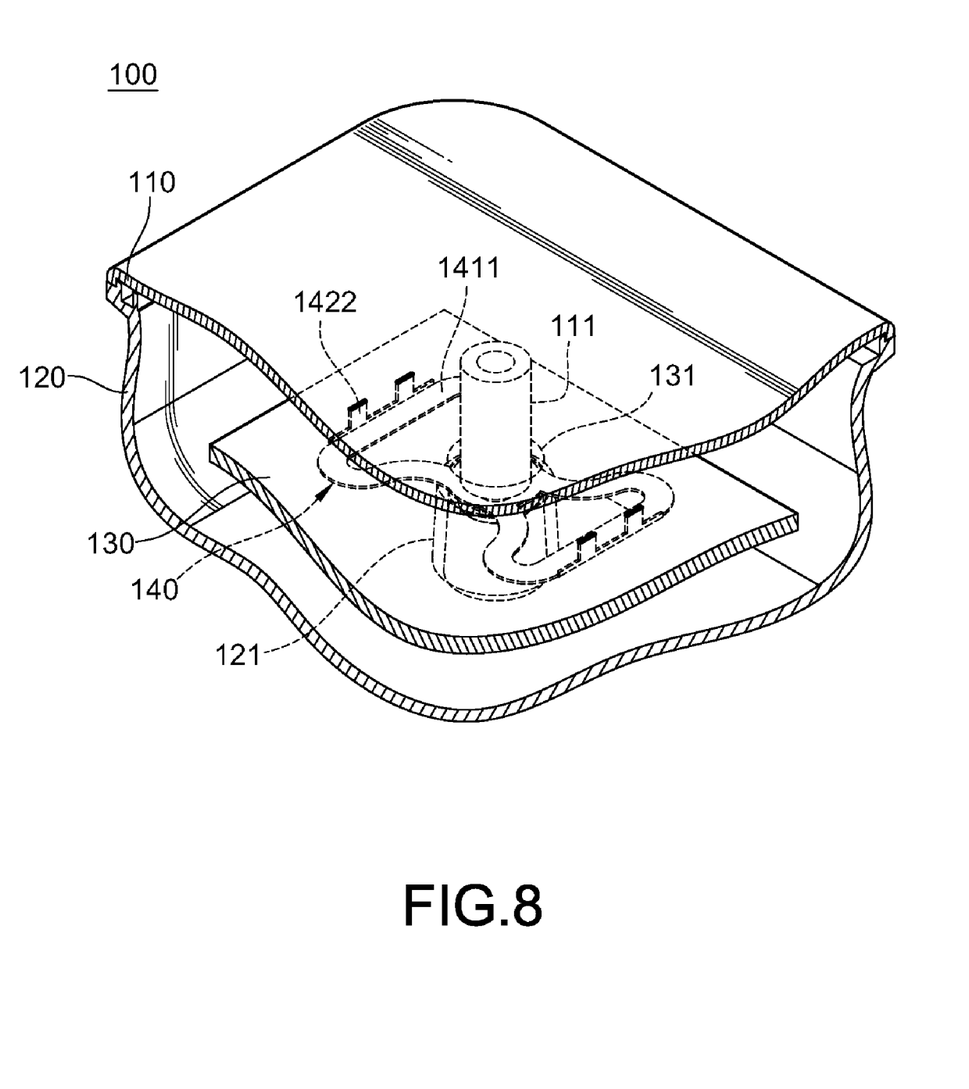
FIG. 8 is a schematic view of the third embodiment of the present invention.
Figure 9:
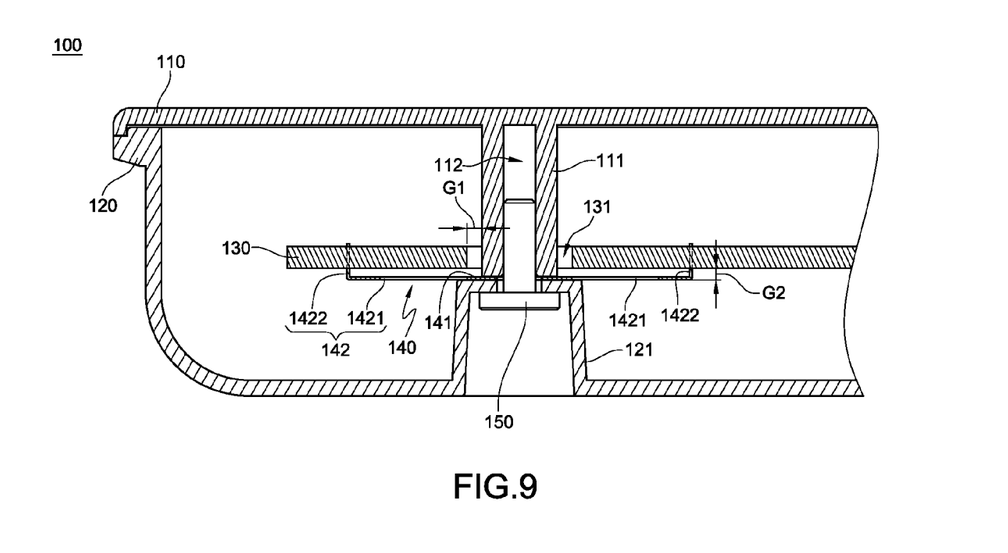
FIG. 9 is a cross-sectional side view of the third embodiment of the present invention.

Referring to FIGS. 7 to 9, the element assembly and the disposition relation of the electronic device 100 according to a third embodiment of the present invention are the same as that of the first embodiment, and thus are not repeated here. The difference between the two embodiments lies in the manner of combining the fixing member 150 and the upper combining column 111. The fixing member 150 according to the third embodiment of the present invention is a pin, the fixing member 150 passes through the hole 122 and the combining hole 1411, and is directly inserted in the fixing hole 112 of the upper combining column 111, so as to fix the main board 130.

In the electronic device of the present invention, through the moving gap generated by reason of the matching of the sizes of the through hole and the upper combining column and the suspending distance between the suspending member and the main board, the main board has the deforming tolerance in the horizontal direction and the vertical direction (three axial directions of X axis, Y axis, and Z axis), and the suspending member provides the elastic deformation function, such that the main board is in the floating state and have preferred buffer capability, thereby preventing the main board from being damaged and losing the electrical connection function by reason of the external force impact or the stress.

What is claimed is:

1. An electronic device structure, comprising:
   an upper case, wherein a lateral side of the upper case has an upper combining column, and the upper combining column has a fixing hole;

a lower case, wherein a lateral side of the lower case corresponding to the upper case has a lower combining column, and the lower combining column has a hole;

a main board, disposed between the upper case and the lower case, and having a through hole and a plurality of combining slots, wherein a size of the through hole is larger than a size of the upper combining column, the upper combining column passes through the through hole, and a moving gap is kept between the upper combining column and the through hole;

a suspending member, disposed between the main board and the lower case, and having a combining portion and two suspending wings extending from the combining portion, wherein the combining portion leans against the lower combining column and has a combining hole, the two suspending wings respectively have a first deforming segment extending from the combining portion and at least one second deforming segment extending from the first deforming segment, the second deforming segment is respectively embedded in the combining slots, such that the combining portion and the main board are spaced by a suspending distance; and a fixing member, passing through the hole and the combining hole and fixed in the fixing hole, such that the main board is disposed on the lower combining column through the suspending member.

2. The electronic device structure according to claim 1, further comprising a screw nut, disposed on the upper combining column, wherein the fixing member is a screw bolt locked with the screw nut.

3. The electronic device structure according to claim 1, wherein the fixing member is a screw bolt, the fixing hole of the upper combining column has a screw thread, and the screw bolt matches with the screw thread and is locked in the fixing hole.

4. The electronic device structure according to claim 1, wherein the fixing member is a pin, and the fixing member is inserted in the fixing hole of the upper combining column.

5. The electronic device structure according to claim 1, wherein the suspending member is made of a metal material.

6. The electronic device structure according to claim 1, wherein the fixing member is a screw bolt.

* * * * *